(12) United States Patent
Fischer et al.

(10) Patent No.: US 7,796,391 B2
(45) Date of Patent: Sep. 14, 2010

(54) JUNCTION BOX TO PROTECT INDIVIDUAL SOLAR PANELS FROM OVERHEATING

(75) Inventors: Ulrich Fischer, Leutkirch-Gebrazhofen (DE); Roland Pfeffer, Leutkirch (DE); Bernd Willer, Moosburg/Isar (DE); Charles Hsu, Tao Yuan Hsien (TW)

(73) Assignee: FPE Fischer GmbH, Leutkirch (DE)

( * ) Notice: Subject to any disclaimer, the term of this patent is extended or adjusted under 35 U.S.C. 154(b) by 0 days.

(21) Appl. No.: 12/303,849

(22) PCT Filed: Apr. 26, 2007

(86) PCT No.: PCT/DE2007/000742
§ 371 (c)(1), (2), (4) Date: Dec. 8, 2008

(87) PCT Pub. No.: WO2007/140736
PCT Pub. Date: Dec. 13, 2007

(65) Prior Publication Data
US 2009/0122492 A1    May 14, 2009

(30) Foreign Application Priority Data
Jun. 9, 2006    (DE) ............... 10 2006 027 104

(51) Int. Cl.
*H05K 7/20* (2006.01)
(52) U.S. Cl. ............... 361/707; 361/704; 361/715; 165/80.3
(58) Field of Classification Search ............ None
See application file for complete search history.

(56) References Cited

U.S. PATENT DOCUMENTS

| 4,707,726 | A * | 11/1987 | Tinder .................. 174/252 |
| 5,648,889 | A * | 7/1997 | Bosli ..................... 361/704 |
| 5,901,034 | A * | 5/1999 | Fuglister ................ 361/641 |
| 6,225,559 | B1 * | 5/2001 | Hubner et al. .......... 174/542 |
| 6,255,722 | B1 * | 7/2001 | Ewer et al. ............. 257/676 |
| 6,266,244 | B1 * | 7/2001 | Guthrie ................. 361/704 |
| 6,545,352 | B1 * | 4/2003 | Ruckdeschel ........... 257/718 |
| 6,714,414 | B1 * | 3/2004 | Dubovsky et al. ....... 361/704 |
| 7,158,376 | B2 * | 1/2007 | Richardson et al. ... 361/679.56 |
| 7,190,589 | B2 * | 3/2007 | Caines et al. ........... 361/707 |
| 7,336,491 | B2 * | 2/2008 | Goemmel et al. ....... 361/707 |
| 7,643,297 | B2 * | 1/2010 | Tominaga et al. ....... 361/704 |
| 2006/0198086 | A1 * | 9/2006 | Wang .................... 361/680 |

FOREIGN PATENT DOCUMENTS

DE  202005007592 U1  7/2005
DE  102005022226 A1  11/2006

* cited by examiner

Primary Examiner—Boris L Chervinsky
(74) Attorney, Agent, or Firm—Patrictia M. Mathers

(57) ABSTRACT

The invention relates to a junction box for solar panels, with which the heat produced in the protecting diodes, MOSFETs or other corresponding power semiconductors of a solar panel can be reliably dissipated. In the junction box, the electronic components are pressed against the housing (1) or into recesses (3) corresponding to the geometry of the components by means of pressure elements, and electrical isolation, preferably a thermally conductive silicone rubber, is provided between the housing (1) and the components.

10 Claims, 2 Drawing Sheets

JUNCTION BOX TO PROTECT INDIVIDUAL SOLAR PANELS FROM OVERHEATING

BACKGROUND INFORMATION

1. Field of the Invention

The invention relates to a junction box for dissipating heat from a solar panel.

2. Description of the Prior Art

According to prior art, solar installations incorporate solar panels of different sizes, whereby the size is determined by the number of series-connected solar cells. In large panels, furthermore, several rows of cells are connected in series. Each row of cells is bridged with a protecting diode installed in the reverse direction. In most cases, a Schottky diode is used, because the forward voltage drop is smaller than with a conventional silicon diode.

When operating solar cells, however, it may happen that individual solar cells are in the shade. The result is that the protecting diode becomes conducting, because the cathode has a lower electrical potential.

Without the protecting diode, the so-called Zener effect would produce a high power loss in the shaded solar cell, leading to a hot spot in this cell and, thus, almost always to destruction of the same. The solar panels, on the other hand, are for their part connected in series, so that a correspondingly high DC voltage passes with currents of up to 6 amperes to an inverter, which produces the AC voltage required for infeeds into the public grid.

The inverters are usually equipped with a communication module, in order to, for example, monitor the power output of the solar installation, either directly by way of a display or with the aid of a computer. The communication module also offers the possibility of remote polling, for example by telephone or via the Internet.

The Schottky diodes arranged above the rows of cells are very important components, because they bridge the respective row of cells when turned off and thus ensure that the current produced by the unshaded cells continues to flow, without the risk of destroying the solar cells. The voltage drop across the diode in the forward direction is relatively low at approx. 0.3 to 0.5 V.

Overtemperature and high field strengths, as could result from lightning strike, for example, lead to destruction of the diode. In the case of a fault, the diode can either open, i.e. there is an interruption between the anode and the cathode, or the diode can short out, in which anode and cathode melt together by arc-welding.

If a diode is short-circuited in operation, only the affected rows of cells are disabled; the system output drops, but this is practically negligible when several panels are in use. If the diode opens, however, this will initially have no effect on operation, provided the row of cells is producing sufficient power. If a cell is shaded, however, the diode can no longer conduct current, a hot spot then arises at the shaded cell, which may lead to destruction of that cell.

To date, only the power output of the whole solar installation is monitored, but not that of the individual panels. In case of a fault, i.e., when the power output of the installation drops, it is thus necessary to check the panels one by one until the defective path is found. Depending on the local circumstances, this is troublesome and time-consuming, and may even be dangerous, for example, when working on a roof. Consequently, repair for a large solar installation is usually complex and thus expensive.

The more critical case for the solar panels, namely a break in a protecting diode, is currently not monitored. As a result, such a failure of a protecting diode often leads to destruction of the cost-intensive solar cells.

In addition to monitoring of the functionality of the protecting diodes, it is important for reliable operation and a long service life of the solar panels to protect the protecting diodes from thermal overloads. When a solar cell is shaded, namely, the protecting diodes must handle high power levels, i.e. they become very hot. Inadequate cooling of the diodes, or even no cooling at all, can lead to immediate failure in extreme cases; in any case, excessive warming will significantly reduce the service life of the diodes. Nevertheless, it is still usual to operate the diodes without particular heat dissipation measures, whereby, in practice, exclusively plastic housings are used, which conduct the heat away only poorly.

In DE 100 50 614 C1, therefore, it is suggested that the protecting diodes be screwed to the inner side of a metal housing, which conducts the heat better; the outer sides of the metal housing can furthermore be provided with cooling fins. There is no teaching, however, as to how the diodes are to be insulated electrically from the housing. Because the cathode or anode of practically all diodes is always connected with the metal side of the diode packaging, the described solution would necessarily cause a short-circuit among the protecting diodes. Furthermore, the proposed screw connection of the diodes will loosen under the influence of temperature fluctuations and the resulting curvature of the metal side of the diodes, with the result that the thermal contact between housing and diode is interrupted. Moreover, the box cannot be opened, repaired or disassembled in case of defective components in the box, because it is adhesively sealed and the seal joint filled. It is also disadvantageous that the module construction is too high, and thus does not fit between the solar module and the roof in installations as they are mounted nowadays; furthermore, the connector channel is arranged for the axial direction, for which there is similarly no space. Given these disadvantages, the proposed solution remained state of the art on paper only.

In addition, DE 10 2004 036 697 A1 describes a junction box for panels of solar cells, which is characterized in that its base plate is made from a material with high thermal conductivity, and that an electrically insulating layer is provided between the base plate and the protecting diode. But here, too, the above-described problem, namely, the constant guarantee of a reliable contact between housing and diode, is not solved.

BRIEF SUMMARY OF THE INVENTION

The objective of the present invention is to overcome the disadvantages of the prior art; in particular, the objective is to create a junction box to protect individual solar panels from overheating.

The object of the invention is achieved by means of a junction box comprising a metal housing that contains one or more electronic components, such as protecting diodes, MOSFETs, power semiconductors, etc. The housing is preferably made of aluminum, although any suitable metal may be used. Cooling fins are provided on the external surface of the housing. In accordance with the invention, pressure elements, which, according to the invention are spring elements, are used to press the diodes, MOSFETs or corresponding power semiconductors assembled therein directly against the inner wall of the housing or into recesses or retainers in this inner wall. The retainers correspond to the geometry of the semiconductors. The electrical connectors of the power semiconductors are hereby electrically insulated from the housing. An easily implemented, inexpensive and thus preferred variant is to press the diodes into grooves formed in the inner wall of the housing by means of a spring clip. The electrical insulation is achieved by such means as plastic or ceramic shims or sheets, or plastic films. Experiments have shown that thermally conductive silicone rubber is especially suitable for this purpose. The silicone rubber is characterized by an extraordinary ability to adapt to form and guarantees excellent heat dissipation, even if the components have very uneven heat dissipation surfaces.

The improved cooling which is thus achieved prevents premature failures of the protecting diodes. The risk exposure of the solar panel due to an open fault in the diodes, in particular, is reduced; at the same time, downtimes and maintenance requirements are also reduced. Finally, the risk of a reduced power output from the solar installation in case of failure of diodes due to short-circuiting is minimized. If further circuitry components are accommodated in the same housing, they also benefit from the better heat dissipation.

BRIEF DESCRIPTION OF THE DRAWINGS

The present invention is described with reference to the accompanying drawings. In the drawings, like reference numbers indicate identical or functionally similar elements.

DETAILED DESCRIPTION OF THE INVENTION

Figure 1:
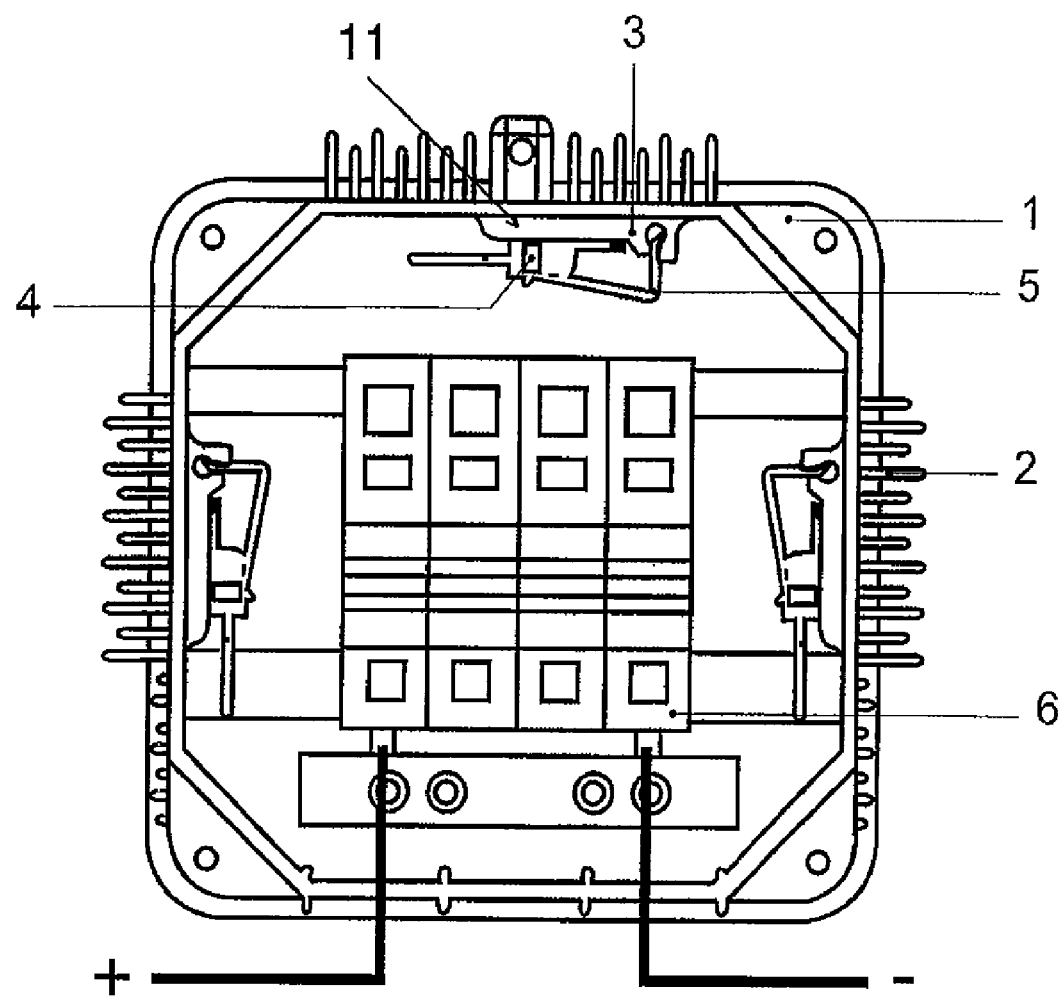
FIG. 1 illustrates the junction box according to the invention.

The invention is explained in greater detail in the following by way of an embodiment; FIG. 1 here shows the junction box.

The junction box depicted in FIG. 1 comprises a metal housing 1, with cooling fins 2 formed on its outside walls. An electronic component, such as a Schottky diode 4, a MOSFET, a power semiconductor, etc., is pressed with the aid of a pressure element 5 into a groove or retainer 3 that is provided on the inner wall of the housing 1. A terminal block 6 is also shown. In the embodiment shown, three retainers 3 are provided and an electronic components 4 is snapped into each of the retainers 3 and held therein by means of the pressure element 5, which is a spring clip 5.

A thermally conductive, but electrically insulating layer 11, constructed as thermally conductive silicone rubber, is provided between the diode 4 and the housing 1. The insulating layer 11 is hidden from view by a wall of the retainer 3. This arrangement protects the diodes 4 against destruction due to overheating.

The inner terminal block 6 is provided with plastic sheathing to increase the electrical breakdown strength in this area. This ensures problem-free compliance with the relevant, increasingly stricter safety requirements, also into the future.

Figure 2:
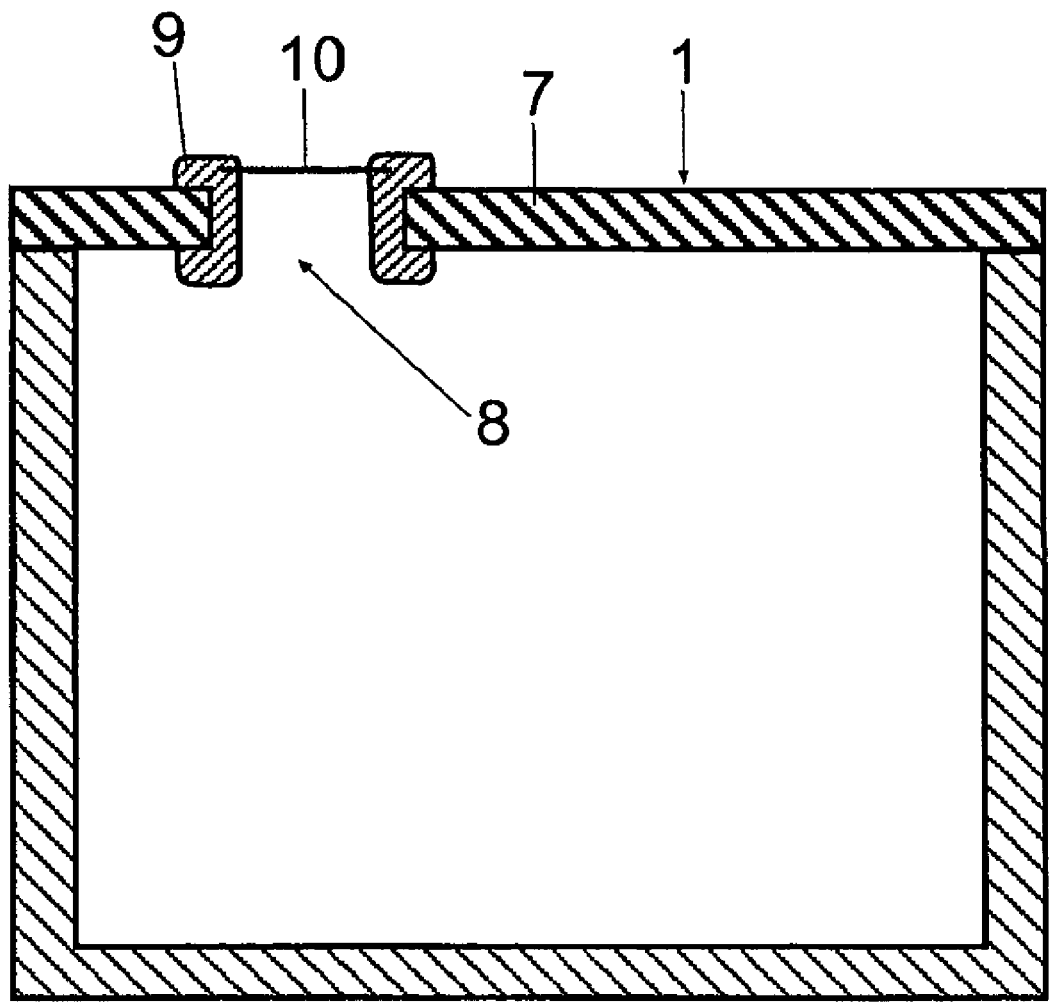
FIG. 2 illustrates a ventilation opening in the housing.

As illustrated in FIG. 2, the housing cover 7 possesses a round opening 8. A retaining ring 9, made of flexible and weather-resistant silicone rubber is inserted into this opening 8. A watertight but air-permeable membrane 10 is welded into the ring 9. The ring 9 is inserted with gentle force, i.e. the silicone rubber always lies against the contact points with the housing cover 7 with a slight pressure. This ensures a gas-tight joint in a simple manner; furthermore, the ring 9 and the membrane 10 can be replaced without great effort, if, for example, the membrane 10 has become clogged with dust or other particles.

The membrane 10 has a diameter of approx. 4 mm. This diameter guarantees optimum ventilation and, correspondingly, a reliable dissipation of humidity from the housing for small to medium-sized housings. For larger housings, it is also conceivable that several such ventilation openings be provided, preferably on opposing sides of the housing.

If additional circuitry components, for example, wireless or bus-wired signaling systems, are accommodated in the same housing, then they similarly benefit from the better thermal properties and the ventilation of the housing 1. The housing 1 is usually attached directly to the panel to be protected.

The invention claimed is:

1. A junction box for solar panels comprising:
   a metal housing with cooling fins formed on an external surface of said metal housing and having a sealed aperture that is air-permeable and water-tight;
   an electronic component that includes a protecting diode;
   a pressure element; and
   electrical insulation means placed between said metal housing and said electronic component;
   wherein a recess is formed in said metal housing, said recess accommodating a geometry of said electronic component; wherein said electronic component is pressed into said recess and retained therein by means of said pressure element applying pressure against said electronic component; and
   wherein said metal housing with said sealed aperture provides a water-tight enclosure about said electronic component.

2. The junction box of claim 1, wherein said electrical insulation means is a ceramic shim.

3. The junction box of claim 1, wherein said electrical insulation means is a thermally conductive silicone rubber.

4. The junction box of claim 1, wherein said electrical insulation means is a plastic sheet.

5. The junction box of claim 1, wherein said electrical insulation means is a plastic film.

6. The junction box of claim 1, wherein said electronic component includes a MOSFET.

7. The junction box of claim 1, wherein said electronic component includes a power semiconductor.

8. The junction box of claim 1, said metal housing further including a cover and wherein said sealed aperture is provided in said cover.

9. The junction box of claim 1, wherein said sealed aperture includes a gas-tight seal around a perimeter of said aperture and wherein an air-permeable water-tight membrane is fitted into said seal.

10. The junction box of claim 1, wherein said pressure element is a spring clip.

* * * * *